(12) United States Patent
Lagasse

(10) Patent No.: US 11,739,917 B2
(45) Date of Patent: *Aug. 29, 2023

(54) MINIATURE LED LIGHTBULB MOUNTING DEVICE

(71) Applicant: Gary Lagasse, Boise, ID (US)

(72) Inventor: Gary Lagasse, Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/652,998

(22) Filed: Mar. 1, 2022

(65) Prior Publication Data
US 2023/0057892 A1 Feb. 23, 2023

Related U.S. Application Data

(63) Continuation of application No. 17/165,723, filed on Feb. 2, 2021, now Pat. No. 11,293,627.

(51) Int. Cl.
*F21V 19/00* (2006.01)
*F21V 29/503* (2015.01)
*F21Y 115/10* (2016.01)

(52) U.S. Cl.
CPC ........ *F21V 19/0055* (2013.01); *F21V 29/503* (2015.01); *F21Y 2115/10* (2016.08)

(58) Field of Classification Search
CPC .. F21V 19/0055; F21V 29/503; F21V 23/001; F21V 29/10; F21S 4/00; F21K 9/00; F21Y 2115/10
See application file for complete search history.

(56) References Cited

U.S. PATENT DOCUMENTS

| | | | |
|---|---|---|---|
| 6,828,170 B2* | 12/2004 | Roberts | H01L 24/05 257/E33.059 |
| 6,936,855 B1* | 8/2005 | Harrah | F21K 9/00 257/59 |
| 9,101,048 B2* | 8/2015 | Nakanishi | H05K 3/00 |
| 11,293,627 B1* | 4/2022 | Lagasse | H05K 1/0203 |

* cited by examiner

*Primary Examiner* — Peggy A Neils

(57) ABSTRACT

The instant invention relates to a sub-miniature high powered light emitting diode and accompanying mounting tab device. The instant invention seeks to provide a solution to light fixture designers by making a readily available and tightly compact light emitting diode mounting device. The instant invention provides for a mounting tab with a heat dissipating element to take advantage of the tiny size of sub-miniature high powered light emitting diodes while adding negligible mounting and heat dissipating elements to set a new lighting device standard in versatility, optimal heat dissipation, and minimal mounting overhead.

9 Claims, 7 Drawing Sheets

MINIATURE LED LIGHTBULB MOUNTING DEVICE

PRIORITY/CROSS-REFERENCE TO RELATED APPLICATIONS

This application is a continuation of and claims priority to pending U.S. patent application Ser. No. 17/165,723 filed on Feb. 2, 2021.

TECHNICAL FIELD

The presently disclosed technology relates to a lightbulb fixtures. More particularly, the present invention is a fixture mounting device for high-powered light emitting diode (LED) bulbs.

BACKGROUND

Since the dawning of electrical lighting back in 1879 when Edison invented the commercially viable incandescent bulb, bulbs have been and still are the overwhelmingly dominant form factor used in light fixtures. However, there are also LED light strips. With LED strips being massed produced, fixtures have suddenly been able to take on a free form. Lighting designer are now able to break free from the bulb and line a free form artistic shape with a plethora of LED strip options from the Home Depot at minimal cost. However, there are limitations to the strips.

For example, the vast majority, if not all, of these strips are constructed of low powered LED's, which require a high number of LED's to produce enough light for a majority of uses. Even with the high number of LED's they put off a soft glow that is not all that bright. Most importantly, with the large number of LED's along with the relatively wide packaging of the strip itself, lighting designers must design the lighting fixture around the strip. As a result, the fixtures are designed around the light bulb or a bulky LED strip. Designers do not have the option to conceive of a shape, design, or structure at will and simply add light to it. It is necessary to start with a bulb or strip then create a structure for it.

And, as versatile as the strip is, conventional bulbs are still the overwhelmingly dominant light source in residential and commercial lighting because LED strips simply do not put out all that much light.

When going with a standard bulb that goes in a socket, designers have a finite number of standard bulb shapes and socket configurations with precise specifications. However, there are no tiny bulbs, LED or standard, known to the inventor, that put out anywhere near something like 220 lumens.

With the advent of LED technologies, which are not only more efficient but are also free of harmful elements such as mercury, lighting design should only be limited by the imagination. While much of the industry seemingly stuck in the old paradigm of using bulbs in a socket with a low lumen to bulb socket size ratio, it does not need to be that way. In fact, there are minuscule high-powered LEDs that put out a phenomenal amount of light. Unfortunately, these also require a high current. Additionally, as a byproduct of that high current, there is a potential for high operational heat that can degrade the device. To prevent degradation of the LED, a substantial thermal mass is needed to absorb and dissipate that heat.

Light strips are typically made of a light weight, inexpensive, flexible, and easy to manufacture dielectric plastic. This limits the light strip to low powered LEDs because the strips do not have the thermal mass needed to absorb and dissipate the heat generated from a high powered LED. There is also the option of using a custom printed circuit board to house the high powered LEDs. However, these custom printed circuit boards must have an added bulk to them to include the required dissipating thermal mass.

Thus, in terms of fixture design, little has changed over the course of the past century. As a result, lighting designers are producing fixtures designed around the bulky standard bulb or low powered LED light strips. The instant invention seeks to resolve this problem with a novel mounting device that is capable of housing a high powered LED bulb while maintaining a minimal size.

SUMMARY OF THE DISCLOSURE

The purpose of the Summary is to enable the public, and especially the scientists, engineers, and practitioners in the art who are not familiar with patent or legal terms or phraseology, to determine quickly from a cursory inspection, the nature and essence of the technical disclosure of the application. The Summary is neither intended to define the inventive concept(s) of the application, which is measured by the claims, nor is it intended to be limiting as to the scope of the inventive concept(s) in any way.

The sub-miniature lighting device has a sub-miniature high powered light emitting diode (LED) module and a mounting tab. The mounting tab has a body with a first end and a second end. The first end of the mounting tab is configured for attachment to a surface, such as the surface of a light fixture, as desired. Preferably, the first end has a predrilled 1.9 mm hole that can be used to mount the sub-miniature lighting device to a metal surface or any other fixture that is desired. This one hole provides a means by which a tiny #2 phillips screw can be screwed into a 1.6 mm hole in the target fixture. This one and only hole in the mounting tab, along with the screw, a #0 washer and hole in the target fixture is all that's needed to mount the sub-miniature lighting device, thereby setting a new industry standard for minimal mounting requirements. It also provides for optimal thermal transfer from the high powered LED to the core of the host fixture. The second end of the mounting tab is preferably flat. The mounting tab may be made from one single uniform piece of copper material, which provides a superior thermal path from the high powered LED to the host fixture to accommodate the significant amount of pinpoint heat generated in such a tiny high powered LED. The mounting tab may also be made from other suitable material. Ultimately the tiny overall dimensions of the completed lighting device, minimal mounting requirements and versatility enables many of these completed lighting devices to be distributed throughout a fixture with aesthetic versatility as well as superior heat distribution throughout the fixture.

In the first embodiment of the invention, there is one sub-miniature light emitting diode module that is connected to the mounting tab at the second end. The light emitting diode module has an anode and cathode wire connector. The anode connector is connected with an anode wire and the cathode connector is connected with a cathode wire. The anode and cathode wires are housed in a dielectric housing. The wires are preferably 22-2 gauge wire.

The light emitting diode module has a bottom side that has a heat pad. The heat pad of the sub-miniature high powered light emitting diode module is directly connected to the mounting tab on the second end using soldering techniques.

A direct connection between just the LED heat pad and the mounting tab forgoes a need for a dielectric sub-mount found in flip chip and other designs. The light emitting diode module is configured to emit 220 lumens of light. The sub-miniature light emitting diode has a preferable sub-miniature size of 3 mm×4.5 mm×2 mm. The heat pad that connects the light emitting diode module to the mounting tab is made from a metallic substance, preferably a single uniform piece of copper, which is a common inexpensive readily available material that is easy to manufacture into a mounting tab and enables a simple thermally effective solder attachment to an LED.

The first embodiment can be connected in a series by configuring the anode wire of one completed device to be connected to the cathode wire of a second device, and so on in a series. The devices at either end of the series are configured to connect to a power source.

In a second embodiment of the invention there is an elongate P-shaped mounting tab. The P-shaped mounting tab has a body with a top end and a long end. The top end of the mounting tab is configured for attachment of the mounting tab to a surface or other fixture. Preferably, the top end has a pre drilled hole. The long end of the mounting tab is preferably flat and is configured to fit an anode pad and a cathode pad on the open side, so as to complete a general rectangular shape. The anode pad and cathode pad are separated by a dielectric substrate so that the anode pad and cathode pad are not in direct contact with each other or with the mounting tab body.

From the anode pad there is a protruding anode wire. The cathode pad has a tapered splice hole that is configured to receive an anode wire. On the bottom of the mounting tab body, the anode pad, and cathode pad is a fitted dielectric film. The dielectric film covers the entirety of the anode pad on the underneath side. The dielectric film partially covers the cathode pad from the underneath side.

In this embodiment, there is at least one sub-miniature light emitting diode that is mounted on the top side of the anode pad and cathode pad and long end of the mounting tab. The light emitting diode is mounted such that is it spaced partially on the anode pad and partially on the cathode pad. The light emitting diode is preferably configured to emit 220 lumens of light. The mounting tab is preferably made from of a copper substance. Other suitable materials may be used for the mounting tab. The anode wire is covered in shrink wrap tubing. The light emitting diode is mounted to the top of the mounting tab through soldering techniques.

Alternatively, there may be placed an anode to cathode pad between the anode pad and cathode pad. This configuration provides the device the ability to have more than one light emitting diode mounted to the top of the device. In such an embodiment, there may be numerous additional anode to cathode pads that are spaced between the anode pad and the cathode pad.

The anode pad and cathode pad and, if included, the anode to cathode pad, are separated using a dielectric substrate. The spacing and separation is configured such that no pad is in direct contact with each other or the mounting tab body.

In a third embodiment of the invention, the mounting tab will have a body that has a first end and a second end. The first end of the body is configured for attachment to a surface or other fixture. Preferably, the first end will have a pre-drilled hole that allows for mounting of the device. The second end of the body has a thermal conducting dielectric epoxy plate. The thermal conducting dielectric epoxy plate is configured to have two electrical lead connections. The electrical leads being one anode wire and one cathode wire. In this embodiment, the electrical leads are configured to attach to any desired light emitting diode.

Still other features and advantages of the presently disclosed and claimed inventive concept(s) will become readily apparent to those skilled in this art from the following detailed description describing preferred embodiments of the inventive concept(s), simply by way of illustration of the best mode contemplated by carrying out the inventive concept(s). As will be realized, the inventive concept(s) is capable of modification in various obvious respects all without departing from the inventive concept(s). Accordingly, the drawings and description of the preferred embodiments are to be regarded as illustrative in nature, and not as restrictive in nature.

DETAILED DESCRIPTION OF THE PREFERRED EMBODIMENTS

Figure 1A:
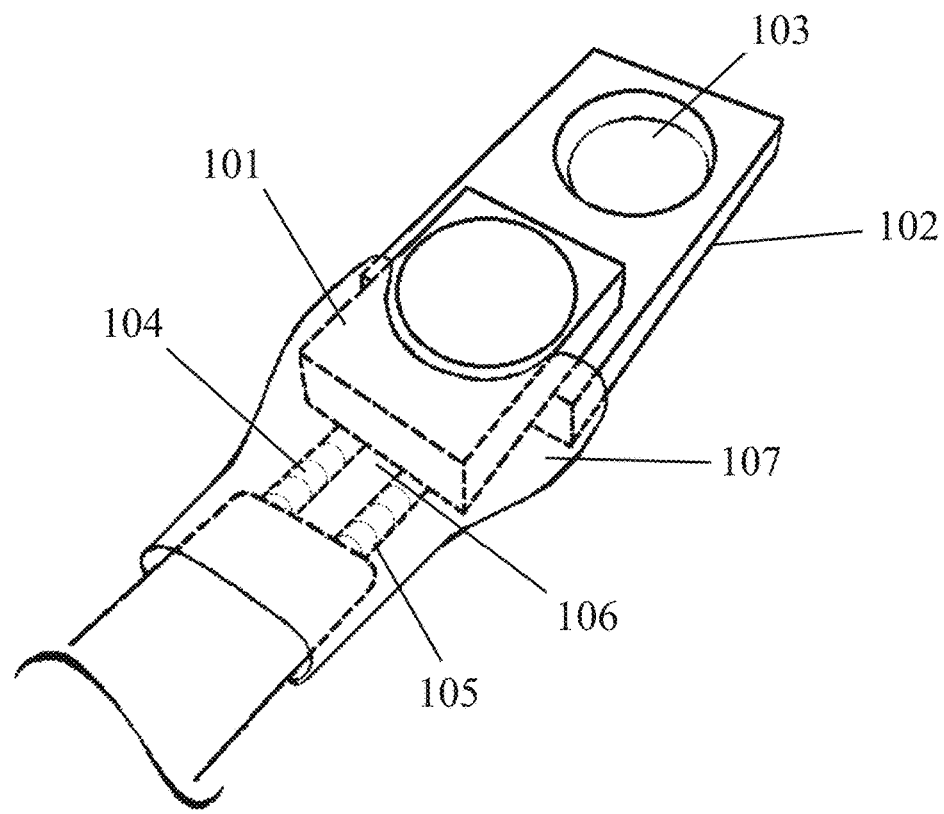
FIG. 1A shows a front perspective view of an embodiment of the invention.

While the presently disclosed inventive concept(s) is susceptible of various modifications and alternative constructions, certain illustrated embodiments thereof have been shown in the drawings and will be described below in detail. It should be understood, however, that there is no intention to limit the inventive concept(s) to the specific form disclosed, but, on the contrary, the presently disclosed and claimed inventive concept(s) is to cover all modifications, alternative constructions, and equivalents falling within the spirit and scope of the inventive concept(s) as defined in the claims.

FIG. 1A shows a front perspective view of a first embodiment of the invention. FIG. 1A depicts the sub-miniature high powered light emitting diode module. The LED module 101 is preferably configured to emit 220 lumens. The light emitting diode module 101 may be a Luxeon® Rebel LXML-PWN1-0120 of the dimensions 3 mm×4.5 mm×2 mm. The light emitting diode module 101 is connected to the mounting tab body 102. The mounting tab body 102 is made from a conductive material, such as copper, to allow for transfer of heat from the LED to the structure. Preferably, the mounting tab body 102 is a 4 mm×7 mm rectangle cut from 26 awg sheet of copper. The mounting tab body 102 has a predrilled hole 103 at one end, opposite the side of the light emitting diode module 101 attachment. The predrilled hole 103 is preferably 1.9 mm in diameter.

Figure 1B:
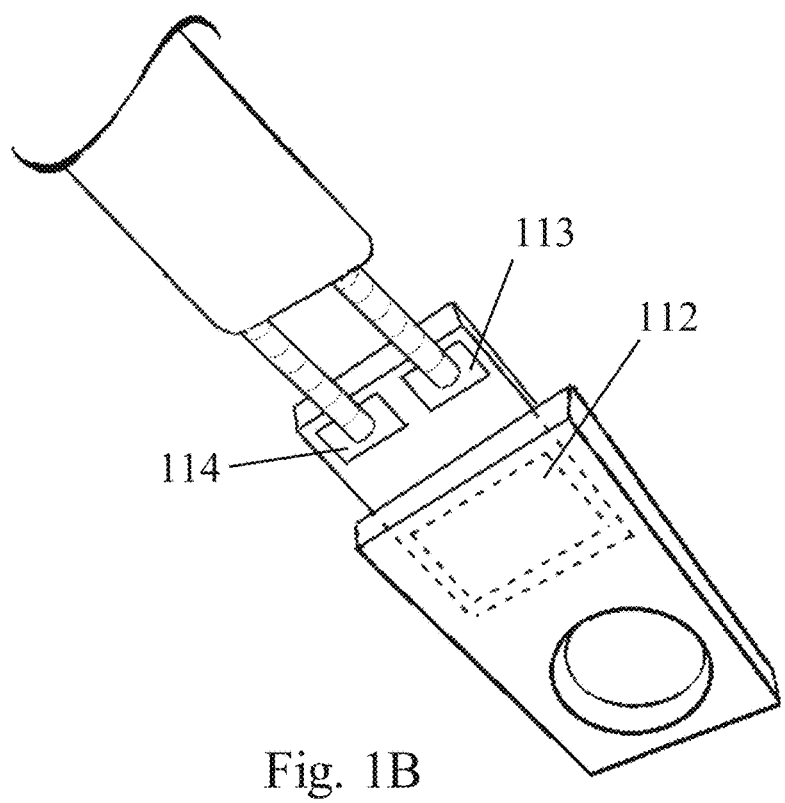
FIG. 1B shows a side perspective view of the embodiment of FIG. 1A.

FIG. 1B shows the first embodiment from a bottom side perspective with the dielectric housing 107 left out of the image for clarity. The heat pad 112 of the light emitting diode module 101 is soldered onto the mounting tab body 102, opposite the end of the predrilled hole 103. The light emitting diode module 101 has an anode wire 104 and a cathode wire 105. Preferably, the anode wire 104 and the cathode wire 105 are 22-2 wire.

The anode wire 104 and cathode wire 105 are connected to the light emitting diode module 101 through an anode pad 114 and cathode pad 113. Connection of the anode wire 104 and cathode wire 105 to the light emitting diode module 101 is completed by soldering techniques at the anode pad 114 and cathode pad 113. A spacer 106 is shown to provide space beneath the light emitting diode module 101 to allow for the wiring connection to the light emitting diode module 101. The anode wire 104 and cathode wire 105 and the anode pad 114 and cathode pad 113 of the light emitting diode module 101 are covered by the dielectric housing 107. The dielectric housing 107 can be shrink wrap tubing.

Figure 1C:
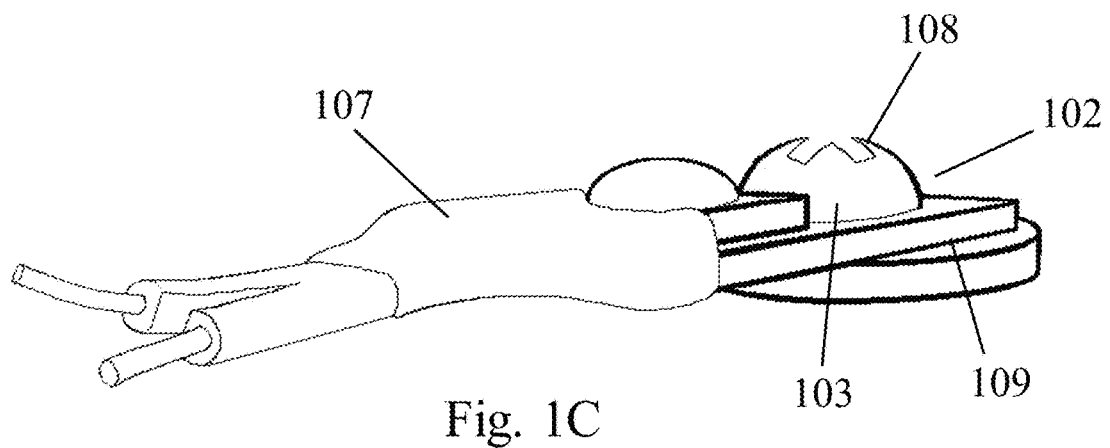
FIG. 1C shows a side perspective view of an embodiment of the invention as mounted to a solid substrate.
Figure 1D:
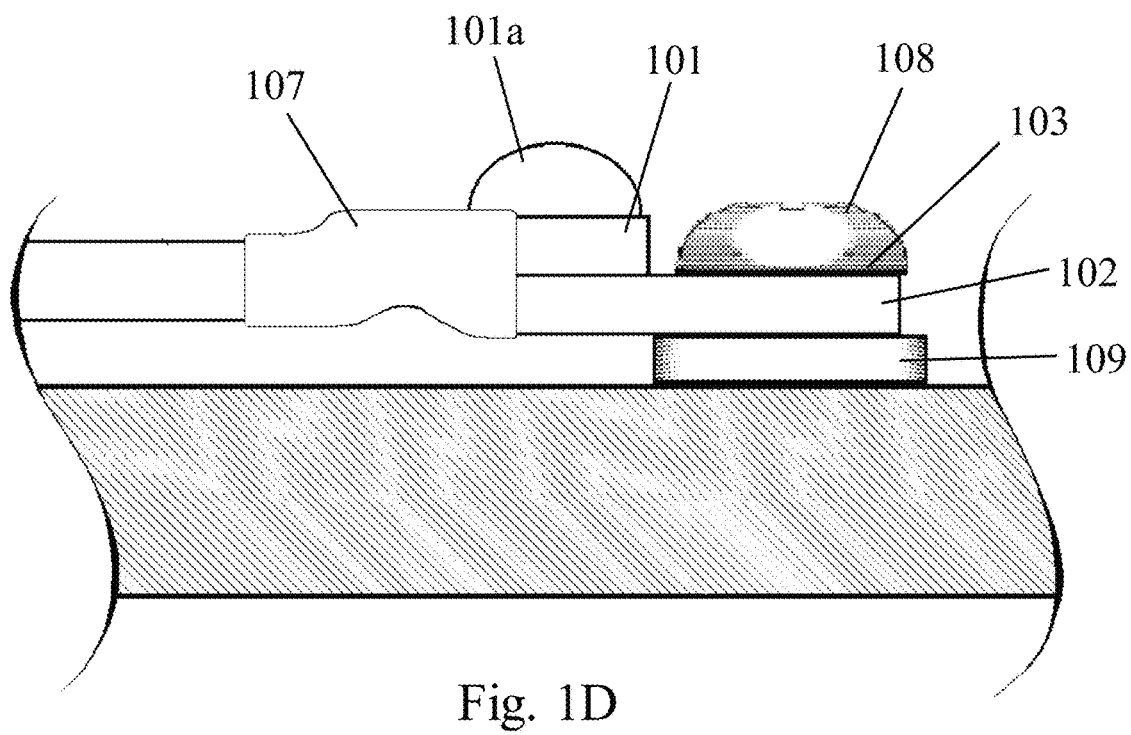
FIG. 1D shows an embodiment of the invention in serial connection.

FIG. 1C shows the first embodiment from a side perspective. FIG. 1B depicts a predrilled hole 103 fitted with a screw 108 and a washer 109 on the bottom. FIG. 1C depicts first embodiment as it is mounted to a solid substrate. FIG. 1D depicts the screw 108 being fitted through the predrilled hole 103. The washer 109 separates the mounting tab body 102 from the solid substrate. Alternatively, an epoxy can be used to attach the mounting tab body to a substrate.

Figure 1E:
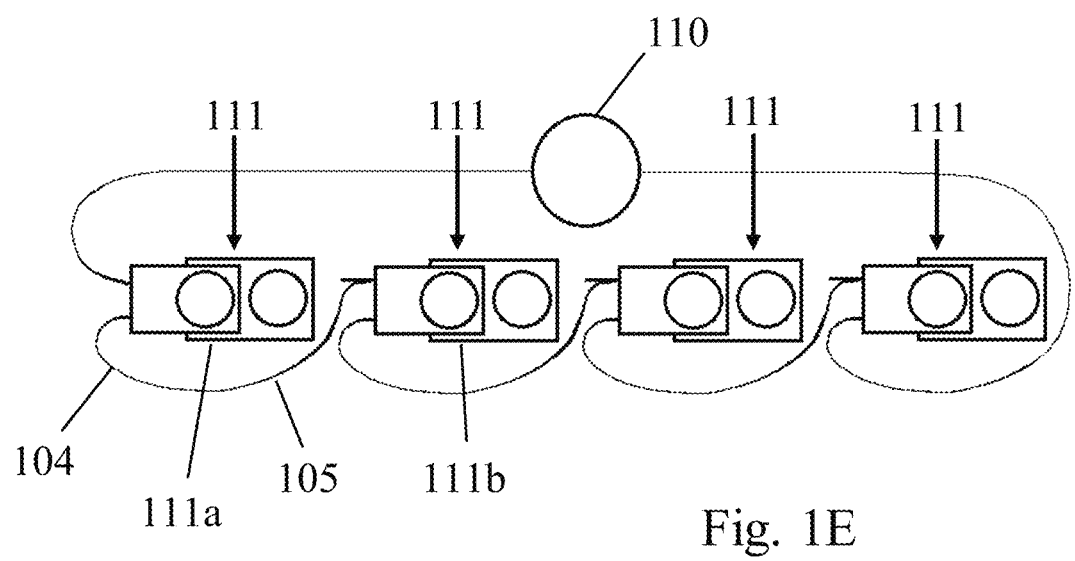
FIG. 1E shows an underside perspective view of the embodiment of FIG. 1A without the dielectric housing for a better view of the internal components

FIG. 1E shows the first embodiment as serially connected to multiple devices of the same embodiment. Depicted is a completed device 111 of the first embodiment as connected to another completed device 111 and as connected to another completed device 111 and so on. The first completed device 111a is connected to the second completed device 111b by connecting the anode wire 104 of the first device 111a to the cathode wire 105 of the second device 111b, and so on. The completed devices 111 are configured to connect to a power source 110 at either end of the series of connections.

A second and third embodiment of the invention, described below, have many of the same characteristics of the first embodiment described above. A nonexclusive list of potential differences in the embodiments are described in detail below.

Figure 2A:
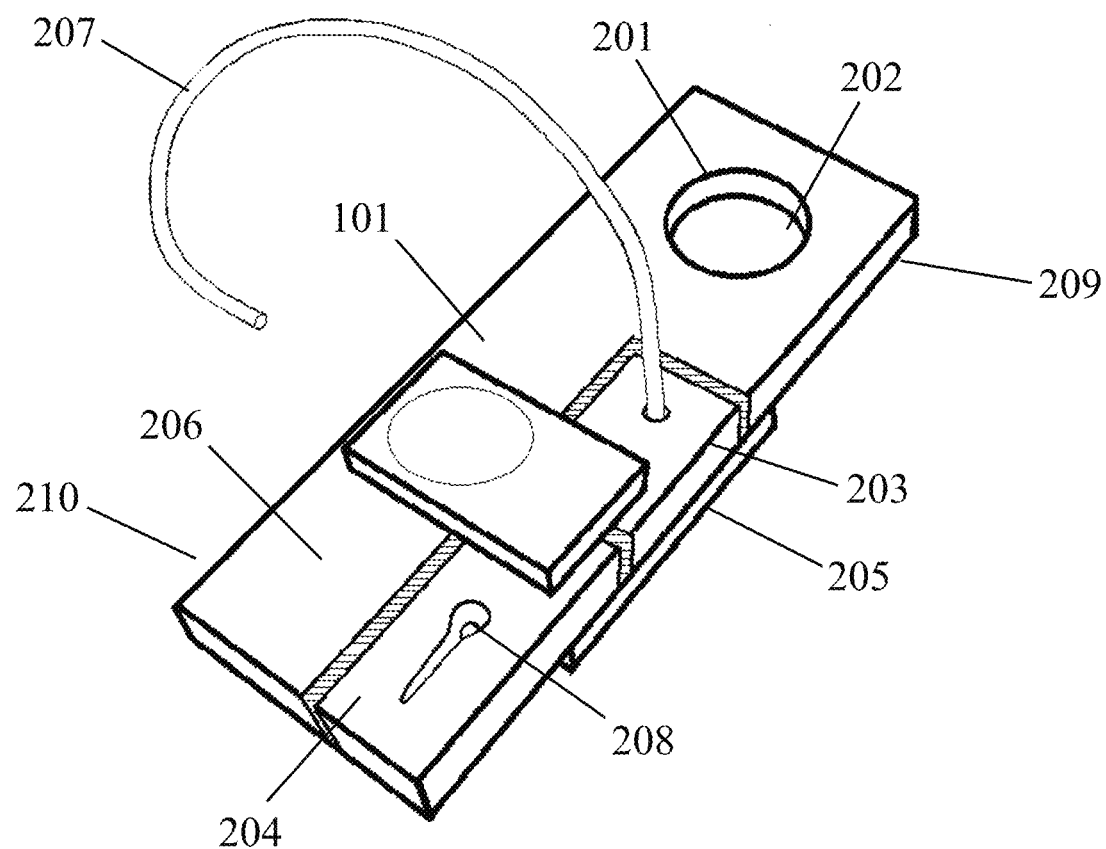
FIG. 2A shows a perspective view of a second embodiment of the invention.

FIG. 2A shows a perspective view of a second embodiment of the invention. FIG. 2A depicts the sub-miniature light emitting diode module 101 as it is connected to the mounting tab body 201. The mounting tab body 201 is generally in a P-shape, with a top end 209 having a pre drilled hole 202 that can be used for mounting. The elongate end 210 of the mounting body is fitted with an anode pad 203 and a cathode pad 204 so as to complete a general rectangular shape. Using soldering paste and soldering techniques, the heat pad of the light emitting diode module 101 is connected to mounting tab body 201. Placement of the light emitting diode module 101 is such that it is partially located on the anode pad 203, the cathode pad 204, and the elongate end 210 of the mounting tab body 201.

The anode pad 203 and the cathode pad 204 are separated from each other and from the mounting tab body 201 by a dielectric substrate 206. The dielectric substrate 206 is preferably heat resistant. On the underneath side of the mounting tab body and anode pad and cathode pad is placed a dielectric film 205. The dielectric film 205 is placed such that it covers completely the anode pad on the underneath side and partially covers the cathode pad and mounting tab body on the underneath side. The dielectric film 205 is secured using soldering techniques.

The anode pad 203 has an anode wire 207 that protrudes from it. The anode wire 207 is covered in shrink wrap tubing. The cathode pad is configured such that it has a tapered splice hole 208 for receiving an anode wire 207 of a separate completed device.

Figure 2B:
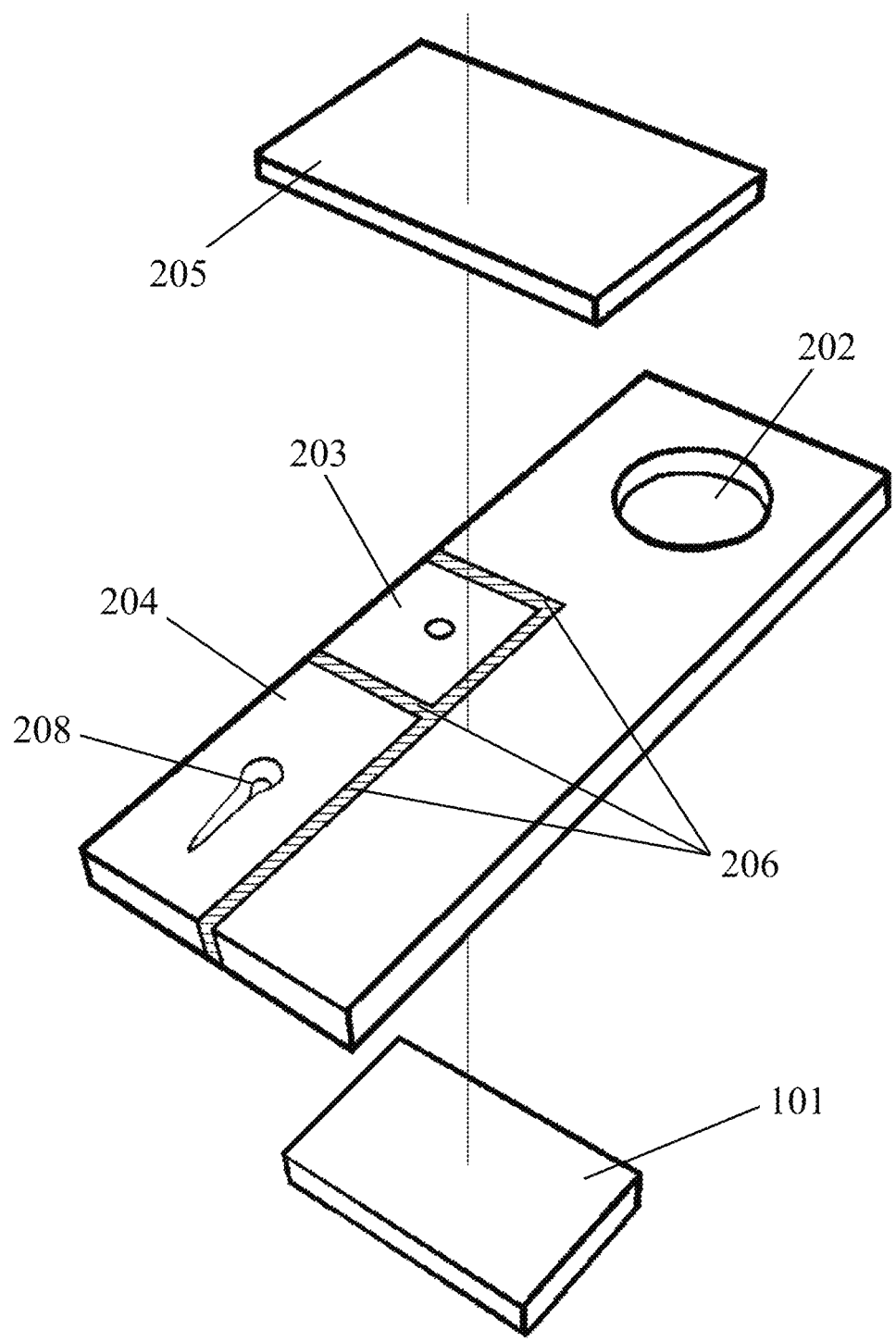
FIG. 2B shows an exploded, inverted perspective of a second embodiment of the invention.

FIG. 2B shows an inverted and exploded view of the second embodiment of the invention. FIG. 2B shows the dielectric film 205 that is secured to the bottom side of the mounting tab 201. The dielectric film 205 can be a heat shrink film. The dielectric film 205 is configured to cover the anode pad 203 completely and the cathode pad 204 and mounting tab body 201 partially. Further depicted is the light emitting diode module 101. The dielectric substrate 206 is configured such that the anode pad 204, the cathode pad 205, and the mounting tab body 201 do not come in direct contact with one another.

Figure 3A:
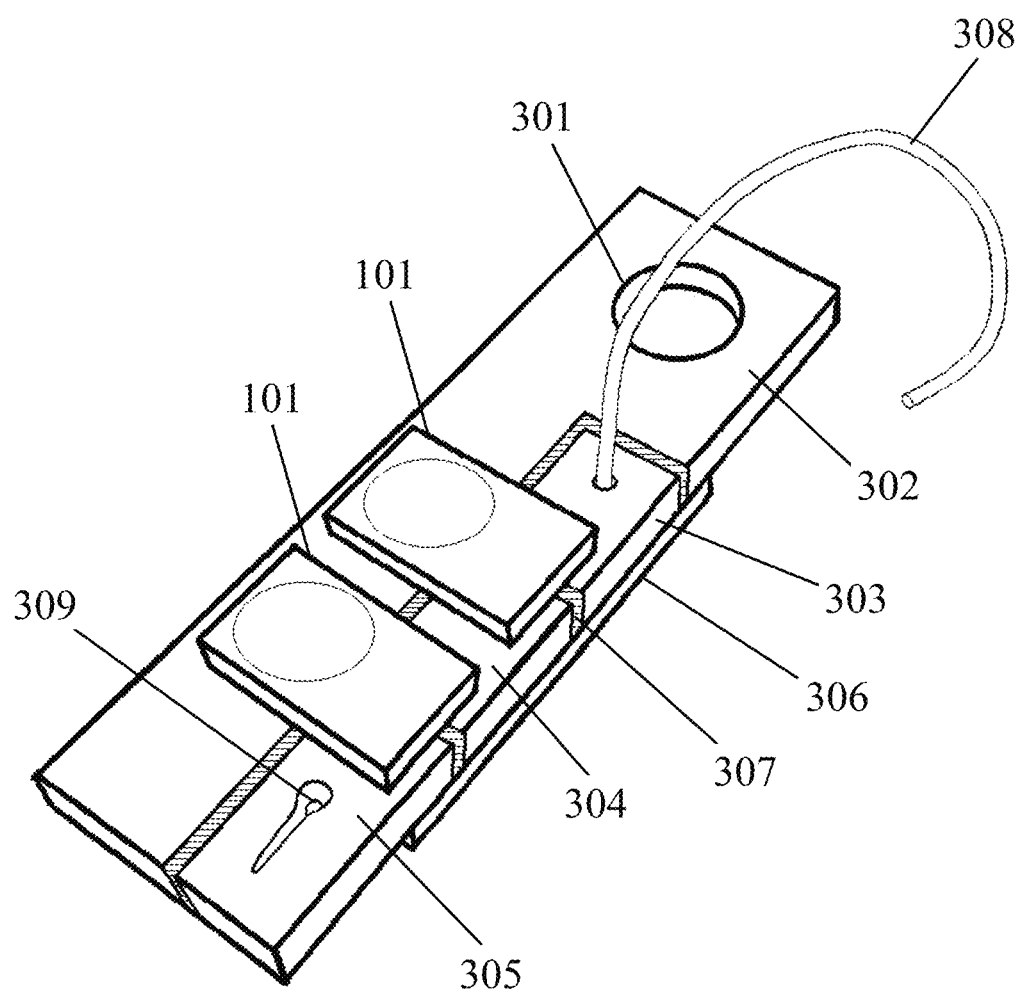
FIG. 3A shows a perspective view of a third embodiment of the invention.

FIG. 3A shows a perspective view of a third embodiment of the invention. FIG. 3A shows the sub-miniature light emitting diode module 101. This embodiment is configured such that two or more sub-miniature light emitting diode modules 101 can be placed on the elongate mounting tab body 301. The mounting tab body, being generally in a P-shape, has a pre drilled hole 302 at the top end for mounting.

FIG. 3A depicts an anode pad 303 and a cathode pad 305. Placed between the anode pad 303 and the cathode pad 305 is an anode to cathode pad 304. The anode pad 303, anode to cathode pad 304 and cathode pad 305 are all separated through the use of a dielectric substrate 307. The dielectric substrate 307 is configured such that no pad or the mounting tab comes into direct contact with one another. The dielectric substrate 307 is preferably heat resistant.

Secured to the bottom side of the elongate mounting tab body is an elongate dielectric film 306, such as a heat shrink film. The elongate dielectric film 306 covers completely the anode pad 303, the anode to cathode pad 304, and partially covers the cathode pad 305. The anode pad 303 has an anode wire 308. The cathode pad 305 has a tapered splice hole 309 for receiving an anode wire 308. The depicted embodiment is configured such that the completed device may connected serially. The tapered splice hole 309 of one device may receive the anode wire 308 of another device, and so on.

Figure 3B:
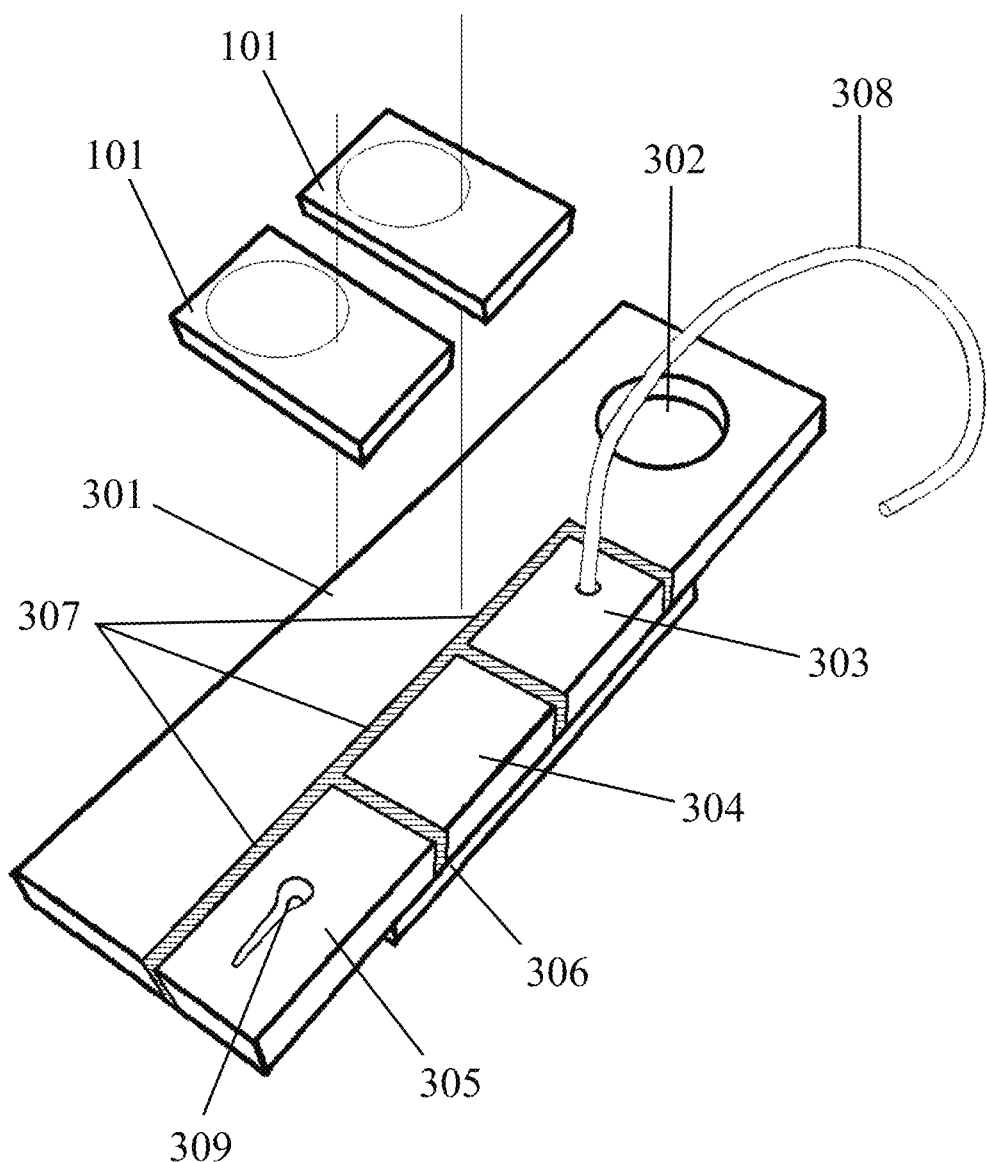
FIG. 3B shows an exploded perspective view of the third embodiment of the invention.

FIG. 3B shows an exploded view of a third embodiment. FIG. 3B depicts the dielectric substrate 307 that is used to separate the cathode pad 305, the anode to cathode pad 304, the anode pad 303 and the mountain tab body 301. Placement of the sub-miniature light emitting diode module 101 is such that the first light emitting diode is partially on the anode pad and partially on the anode to cathode pad. The second light emitting diode is placed such that it is partially on the anode to cathode pad and partially on the cathode pad. All parts are secured together using soldering techniques.

Figure 4:
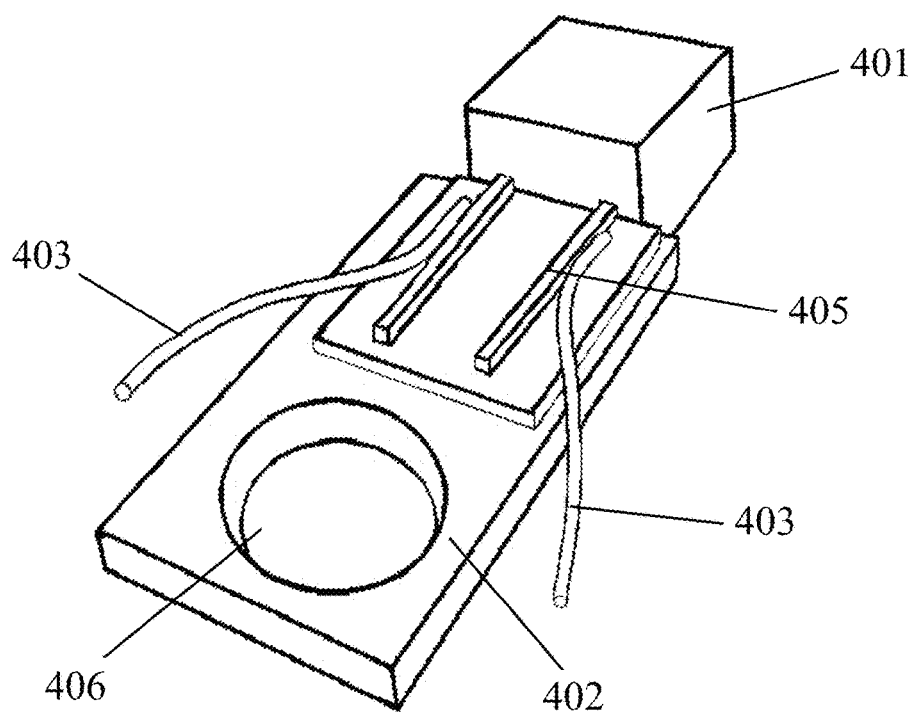
FIG. 4 shows a perspective view of a fourth embodiment of the invention.

FIG. 4 shows a perspective view of a fourth embodiment of the invention. FIG. 4 shows a light emitting diode package 401. The light emitting diode package 401 has two electrical leads 403. The two electrical leads 403 are connected to the mounting tab body 402 through the use of a thermal conducting dielectric epoxy 405. The thermal conducting dielectric epoxy is preferably Arctic Silver® thermal conducting dielectric epoxy. The mounting tab body 402 has a predrilled hole 406 for mounting, opposite the thermal conducting dielectric epoxy 405.

Figure 5:
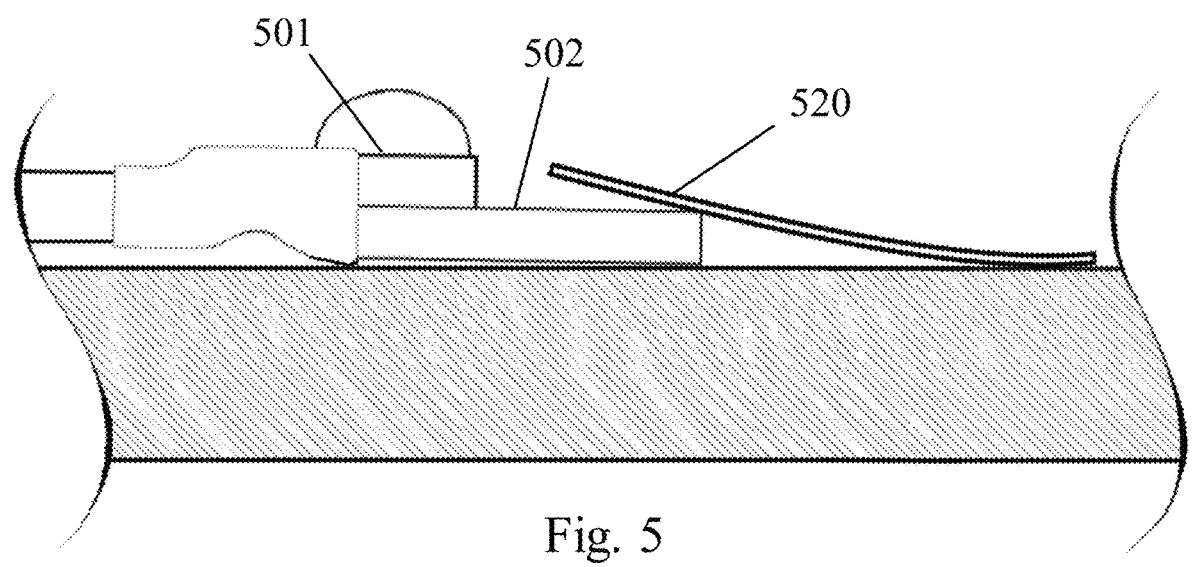
FIG. 5 shows a perspective view of a fifth embodiment of the invention.

FIG. 5 shows perspective view of a fifth embodiment of the invention. FIG. 5 depicts the mounting tab body 502 being at one end, opposite the light emitting diode 501, configured for attachment 520 to a surface substrate. Attachment of this configuration may be achieved through spot welding techniques, use of an epoxy, or other clips or clasps. It would be readily understood to a person having ordinary skill in the art that this configuration, where the mounting tab body is configured for attachment not using a pre-drilled hole, may be readily adopted to all other embodiments disclosed herein.

While certain preferred embodiments are shown in the figures and described in this disclosure, it is to be distinctly understood that the presently disclosed inventive concept(s) is not limited thereto but may be variously embodied to practice within the scope of the following claims. From the foregoing description, it will be apparent that various changes may be made without departing from the spirit and scope of the disclosure as defined by the following claims.

I claim:

1. A sub-miniature LED and mounting tab comprising:
a mounting tab having a mounting tab body with a first end and second end, wherein said first end is configured for attachment to a mounting surface, wherein said first end and said second end of said mounting tab body are comprised of a uniform material, wherein said uniform material is a thermal conducting uniform material;
said second end of said mounting tab body connected to at least one sub-miniature light emitting diode module having an anode pad and cathode pad and a bottom side heat pad, wherein said bottom side heat pad is connected to said mounting tab body such that said LED module is in direct contact with said mounting tab body and said heat pad is configured to dissipate heat from said LED module through said heat pad to said mounting tab body, wherein said mounting tab body is configured to further dissipate heat to an underlying structure said mounting tab is mounted too; and
an anode wire connected to said anode pad and a cathode wire connected to said cathode pad, wherein said anode wire and said cathode wire are configured for connection to a power source.

2. The device of claim 1 wherein said mounting tab is rectangular.

3. The device of claim 1 wherein said first end has a predrilled hole of approximately 1.9 mm in diameter that is configured for attachment of said mounting tab to a surface.

4. The device of claim 1 wherein said second end of said mounting tab body is flat.

5. The device of claim 1 wherein said light emitting diode is configured to emit two-hundred twenty (220) lumens of light.

6. The device of claim 1 wherein said uniform material is copper.

7. The device of claim 1 wherein said anode wire and said cathode wire are housed in a dielectric housing.

8. The device of claim 7 wherein said dielectric housing comprises shrink wrap tubing.

9. The device of claim 1 wherein a plurality of said sub-miniature light emitting diodes and mounting tabs are serially connected.

* * * * *